United States Patent [19]

Trachtenberg et al.

[11] Patent Number: 4,823,554

[45] Date of Patent: Apr. 25, 1989

[54] VEHICLE THERMOELECTRIC COOLING AND HEATING FOOD AND DRINK APPLIANCE

[76] Inventors: Leonard Trachtenberg, 512 Pleasant Valley Way, West Orange, N.J. 07052; Peter W. Trachtenberg, R.D. 6, Box 505, Branchville, N.J. 07826

[21] Appl. No.: 220,022

[22] Filed: Jul. 15, 1988

Related U.S. Application Data

[63] Continuation of Ser. No. 41,093, Apr. 22, 1987, Pat. No. 4,759,190.

[51] Int. Cl.[4] ............................................. F25B 21/02
[52] U.S. Cl. .......................................... 62/3; 62/239; 62/244; 62/457
[58] Field of Search ....................... 62/3, 457, 239, 244

[56] References Cited

U.S. PATENT DOCUMENTS

| | | | |
|---|---|---|---|
| 2,973,627 | 3/1961 | Lackey et al. | 62/3 |
| 2,991,628 | 7/1961 | Tuck | 62/3 |
| 3,167,925 | 2/1965 | Elfuing | 62/3 |
| 3,225,549 | 12/1965 | Elfuing | 62/3 |
| 3,986,337 | 10/1976 | Richard | 62/3 |
| 4,089,184 | 5/1978 | Beitner | 62/3 |
| 4,612,772 | 9/1986 | Jones | 62/3 |

FOREIGN PATENT DOCUMENTS

1126426  3/1962  Fed. Rep. of Germany ............ 62/3

Primary Examiner—Lloyd L. King

[57] ABSTRACT

A novel portable thermoelectric cooling and heating food appliance adapted for use in a vehicle by travelers, hunters, and campers. A base unit is provided which can be connected to the cigarette lighter receptacle of the vehicle and with the use of thermoelectric Peltier elements offer through a selective cool or heat control circuit the cooling or heating required of any of several kinds of appliances that can be detachably attached to the base unit and adapted through cool and heat conducting transfer plates to cool or heat the appliance and the foods or liquids therein and upon removal of the appliance from the base unit the bottom of the appliance is closed by a slide cover to cover the bottom conducting plate of the appliance so the food or liquids will be kept in the cool or heat condition. Ice cubes can be made by drawing cold air from the air conditioner vent of the vehicle to be passed over the action elements of the base unit and at the same time provides means for further cooling ambient air about the appliance and in the vehicle.

8 Claims, 8 Drawing Sheets

VEHICLE THERMOELECTRIC COOLING AND HEATING FOOD AND DRINK APPLIANCEr

This application is a continuation of application No. 7,041,093, filed Apr. 22, 1987, now U.S. Pat. No. 4,759,190.

This invention relates to a portable thermoelectrically-operated cooling and heating base unit to which any of a set of food appliances can be detachably connected to cool or warm food therein, the appliances having means for covering their cool or heat exchange bottom portions to maintain the temperatures of their cooled or heated space therein and a selective control circuit therefor.

BACKGROUND OF THE INVENTION

Thermoelectric heat transferring elements have been in use in portable refrigerators, or coolers for some time for cooling a food storage compartment to preserve food placed therein. One example of such a portable cooler employing these solid thermoelectric heat exchange elements operable on known Peltier elements is disclosed in U.S. Pat. No. 4,301,658 and the prior art that was cited. The Peltier elements for refrigeration are applied as cooling elements in the portable refrigerators but by the nature of these elements they can equally be suitable for supplying heat. These prior appliances have heretofore, only been provided for cooling and refrigeration storage and have not been adapted for the multiple appliances should one have to carry out the ordinary procedures with foods and liquids.

SUMMARY OF THE INVENTION

According to this invention, use is made of the Peltier elements for heating and warming as well as for cooling, or refrigerating purposes. A base unit with foods has been provided wherein the Peltier units can be selectively conditioned by an electric control circuit for the delivery of either cold or heat to a metal plate conductor for the cooling or heating of a detachable food containing appliance that will have a similar metal plate for the transfer of cool or heat to the appliance when detachably assembled upon the base unit.

The Peltier elements are of a sandwich-like construction of top and bottom metal face plates with multiple thermocouples disposed therebetween and when direct current as from an automobile battery is passed on one direction through the elements as assembled in the base unit, the top face plates by the use of a cooling fan upon their bottom faces is made to cool the attached appliance, but when the current is passed in the opposite direction by selective switching, the top face plate becomes the hot plate and bottom face plate becomes the cool plate, with no use needed of the cooling fan. A control circuit has been provided so that by a mere flip of a switch reversal of the flow of direct current is effected to have the cold or heat transfer to the various appliances usable with the base unit. The base unit includes a relatively thick block to dissipate heat from the bottom face plates of the elements and which has depending cooling fins through which cooling air is passed when the unit is set to cool the appliance. A mere reversal of the direction of the current, reverses the temperatures of the face plates of the Peltier elements and the cold to heat or vice versa. The present arrangement provides a full purpose outlay for campers, hunters and travelers by access to their vehicle direct current battery and by replacing the vehicle direct cigar lighter cable connection with a recycling convertor and cable assembly the base unit can be connected into a household alternating current receptacle source. The present appliance arrangement provides a base and multiple, quick, and detachable appliances have been made to respectively carry out the several procedures for maintaining the cool or heat temperatures needed to keep food or liquids cool or warm.

To extract cold or heat from the faces of the thermoelectric elements, it is done by conduction to metal blocks or plates in the base and appliance in order to expand the concentrated cold or heat of the element faces. To have cold from the top face of its elements, heat is removed from the bottom hot face. This is done by the cooling fins from a hot metal block and an electric fan for moving air over the fins, leaving the cold face to deliver cold to an insulated compartment for storing food as with a refrigerator. Such a union of the detachable appliance must have flush contact with the face plates of the thermoelectric base unit when placed home upon the elements containing the base unit to ensure efficient and full transfer of cold or heat.

The multiple detachable appliances may include a refrigerator or hot box assembly, a hostess tray and a carrying case therefore, a bottle heating and cooling assembly, and an ice cube maker and air conditioner assembly. This air conditioner assembly will utilize the already controlled low temperature of piped cold conditioned air for making the ice cubes and will have further lowered the air temperature within the vehicle. The present ice cube making appliance thus incidentally allows the same to become means for lowering the overall temperature of the passenger space within the vehicle.

OBJECTS OF THE INVENTIONS

It is the principal object of the present invention to provide a portable thermoelectrically-operated appliance suitable for both cooling and heating from a vehicular battery.

It is another object of the invention to provide a thermoelectrically-operated base unit serving to selectively supply cold or heat and to which different multiple appliances may be detachably secured as desired for their separate use.

It is still another object of the invention to provide an assembly of a thermoelectric base unit and detachable appliances in which the cool or heat transfer metal plate faces thereof will be held in a tight, accurate and conductive flush engagement with one another on the appliance being slide fitted to the base unit so as to ensure the required maximum conduction transfer of cold or heat.

It is another object of the invention to provide a portable thermoelectrically-operated appliance suitable for cool food storage and for heating with an electric source from either the vehicle battery through the cigarette lighter or from any outlet alternating current source within a household.

It is a further object of the invention to include with a guide detachable assembly of a thermoelectric base unit and multiple appliances, an appliance suitable for producing ice cubes, that will be detachably connected to the air conditioning or venting system of a vehicle to obtain controlled colder ambient temperature and to provide colder air for the thermoelectric base unit and thereby to augment the normal cooling output of the base unit.

It is still a further object of the invention to provide a thermoelectric cooling arrangement for lowering the temperature of the passenger space within a vehicle by several degrees below the lowered temperature already effected by its air-conditioning system to ensure adequate cooling of the vehicle in abnormally hot weather.

It is a still further object of the invention to provide in the thermoelectric heating and cooling assembly a simple electric control system with a panel that presents to the user but the need to connect a plug to the cigarette lighter vehicle dashboard battery outlet or with a recycling convertor to a household receptacle and by which with a mere flip of a panel switch on the base unit for selecting for affecting the delivery of either hot or cold.

Still further objects of the invention are to provide an assembly of a thermoelectrically-operated base unit and quick attached, multiple appliances, having the above objects in mind, which will be simple in construction, easy to separately assemble, of minimum parts, consumes little space in use of in storage, each of pleasing appearance, solid and firm, and sold either as a complete assembly or a base unit with certain selected appliances, effective in use and efficient in operation.

BRIEF DESCRIPTION OF THE DRAWINGS

For a better understanding of the invention, reference may be had to the following detail construction taken in connection with the accompanying drawing, in which.

DETAILED DESCRIPTION OF THE INVENTION

Referring now particularly to FIGS. 1 to 6, a description of a thermoelectric base unit 10 will be made. This base unit 10 comprises generally a molded channel-shaped housing part 11, having a bottom portion 12, and opposing upstanding sidewalls 13 and 14 to which all the other parts are assembled. The inner face of the sidewalls 13 and 14 respectively have longitudinally-extending grooves 13' and 14' of the same level and opposing one another. These grooves slidably support a plate 16 having a large central opening 16' with which is aligned an electric fan 17 with fan blades 18 serving to deliver air under pressure upwardly through the opening 16. The motor 17 is attached by screws 19 that fasten the fan motor by its flange 17' to the underface of the supporting plate 16 and can be slidably removed from the housing part 11 therewith. Current will be supplied to the electric fan 17 through lead wires 20. Foot cylinders 21 are respectively fastened to the respective corner of areas of the housing bottom portion 12 by fastening screws 22.

Inwardly-extending molded projection 13a, 14a and 13b, 14b respectively provided at opposite ends of sidewalls 13 and 14 serve to fix a top plate 23 of sheet insulation by fastening screws 24 and to the underside of the top plate 23, there is attached a thermoelectric heat sink or block assembly 26 by means of fastening screws 27 so as to be suspended therefrom and removable from the housing part 11 with plate 23.

To projections 13a and 14a on the sidewalls 13 and 14 of housing 11 and at the bottom 12 to similarly-arranged inwardly-extending projections 13c and 14c, there is attached a front switch control panel plate 28 by screws 29 and that has elevated ventilating openings 28', an electric switch 32, an electric plug receptacle 33 and other electric elements and wiring carried on the rear face of plate 28. At the rear of the unit, a rear panel 34 with ventilating openings 34' is attached by screws 36 to inwardly-extending sidewall projections 13b, 14b and 13d and 14d lying therebelow to the rear end of the housing part 11. The ventilating openings 28' and 34' of the respective plates 28 and 34 are essential to effect the cooling of the thermoelectric assembly 26 by the ventilation fan 18 at times when the assembly 26 is used for cooling the different appliances.

Figure 5:
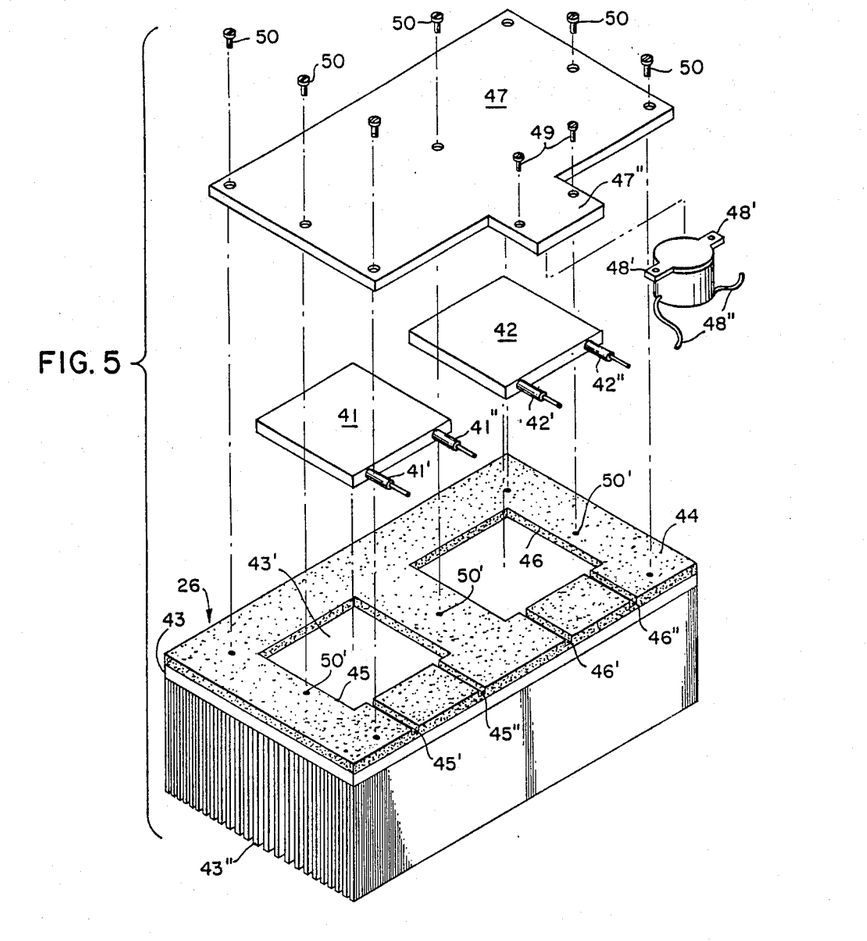
FIG. 5 is an exploded view of the heat and cold producing transfer plate and elements removed from their finned block support.

In FIG. 5, the parts of the thermoelectric assembly 26 are best shown and will be described with reference thereto. Two solid state thermoelectric of Peltier type elements 41 and 42 are used to obtain the cooling and heating effects. These Peltier elements 41 and 42 are mounted in flush contact with the top surfaces 43' of a heat sink conductor block 43 of high thermal conductivity aluminum and having a series of spaced cooling fins 43" depending from its bottom face. To retain the elements 41 and 42 in good conductive relationship they are attached with a low melting point tin alloyed solder to ensure the best performance of generated heat transfer of the element to the block 43. The Peltier elements when supplied with direct current as from a 12-volt vehicle battery, or of other voltage will present much cold on its top cold face if heat is dragged from it's bottom hot face. For this purpose, the heat transfer block 43 is put into use with operation of the electric motor driven fan 17 to cause the flow of venting air over its fins 43" and through the air louvre openings of the front and rear end plates 28 and 34 of the base unit. When heating is to be effected the ventilating fan 17 is omitted from the Power supply circuitry. The reversal of the direct current flow converts the elements for cooling or heating. Their top surfaces can present either cold or heat. The fan 17 is only brought into use when effecting cooling by the elements.

Adhered to the top surface 43' of the heat conducting block 43 is an insulated mass layer 44 that surrounds the thermoelectric elements 41 and 42. The elements 41 and 42 will be confined within square pockets 45 and 46 of the mass layer 44 in flush engagement with the block top surface 43' and with their respective lead wires 41', 41" and 42', 42" respectively extending outwardly through corresponding parallel channel grooves 45', 45" and 46', 46".

Spanning these thermoelectric elements 41 and 42 laying in the pockets 45 and 46 and over the heat insulating mass layer 44 is a principal heat and cold conducting or transfer plate 47 of highly conductive aluminum to expose and distribute the cold or heat adequate to transfer the necessary cold or heat to the appliances being used with the base unit at the time. This conducting plate 47 is firmly held down in place in a flush and compressive manner upon the top faces of the thermoelectric elements 41 and 42 by fastening screws 50 into tapped holes 50' in the element assembly 43 and from this conductive plate 47 the cold or heat passes to any of the several appliances that will be detachably and slidably fitted upon the base unit 10.

At one side of the conducting or transfer plate 47 is a laterally-extending side projection 47" to the underface of which a housed thermoelectric switch 48 is fixed by top fastening screw 49 entering side projections 48' of top enclosure portion of the switch 48 so that the top face of the switch housing will have cold and hot conductive engagement with the underface of the conducting plate 47 so as to ensure the best heat exchange of the conductor plate to the thermoelectric switch 48. This switch 48 is but a simple bimetallic snap action switch and is worked into the circuit in a manner as will be made apparent from a later description of the circuit diagram. The purpose of this switch 48 is to prevent the thermoelectric elements 41 and 42 from burning out and yet to provide adequate temperature for the transfer plate 47 and the appliance attached to the base unit 10. The elements 41 and 42 will stand prolonged heat at some 180 degrees Fahrenheit but will become inoperable above 212 degrees F., the boiling point of water. These present elements are accordingly inadequate to provide high temperatures for cooking which is not the intent with the present appliance since the present intent is merely to keep pre-cooked food warm for final consumption or cold to preserve it. Eventually, it is believed that with the advent of new materials that elements of this type will be developed to permit the elements to be used to effect food cooking temperatures without being burned out. Wires 48" extend from the thermostatic switch 48. While the pockets 45 and 46 and wire outlets 45', 45" and 46', 46" as shown have been cut out of rigid heat insulation this same insulation can be provided by foam insulation poured into the space between the fastened assembly of the heat conducting block 43, elements 41 and 42 and the heat transfer plate 47 and permitting the foam to set. The object is to fully contain the elements 41 and 42 so that there will be little loss of heat or cold while being directed by the elements to the heat conducting cooling block 43 and unit transfer plate 47.

Figure 3:
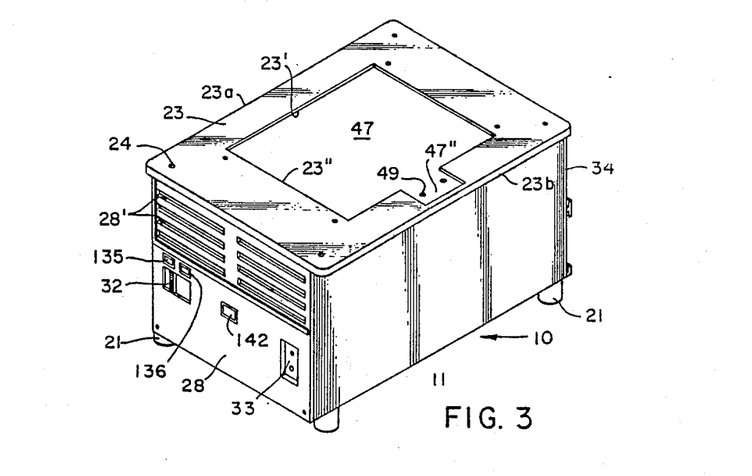
FIG. 3 is a top and front end perspective of the thermoelectric base unit free of an attached appliance and looking upon the sink well cold and heat transfer surface thereof.
Figure 4:
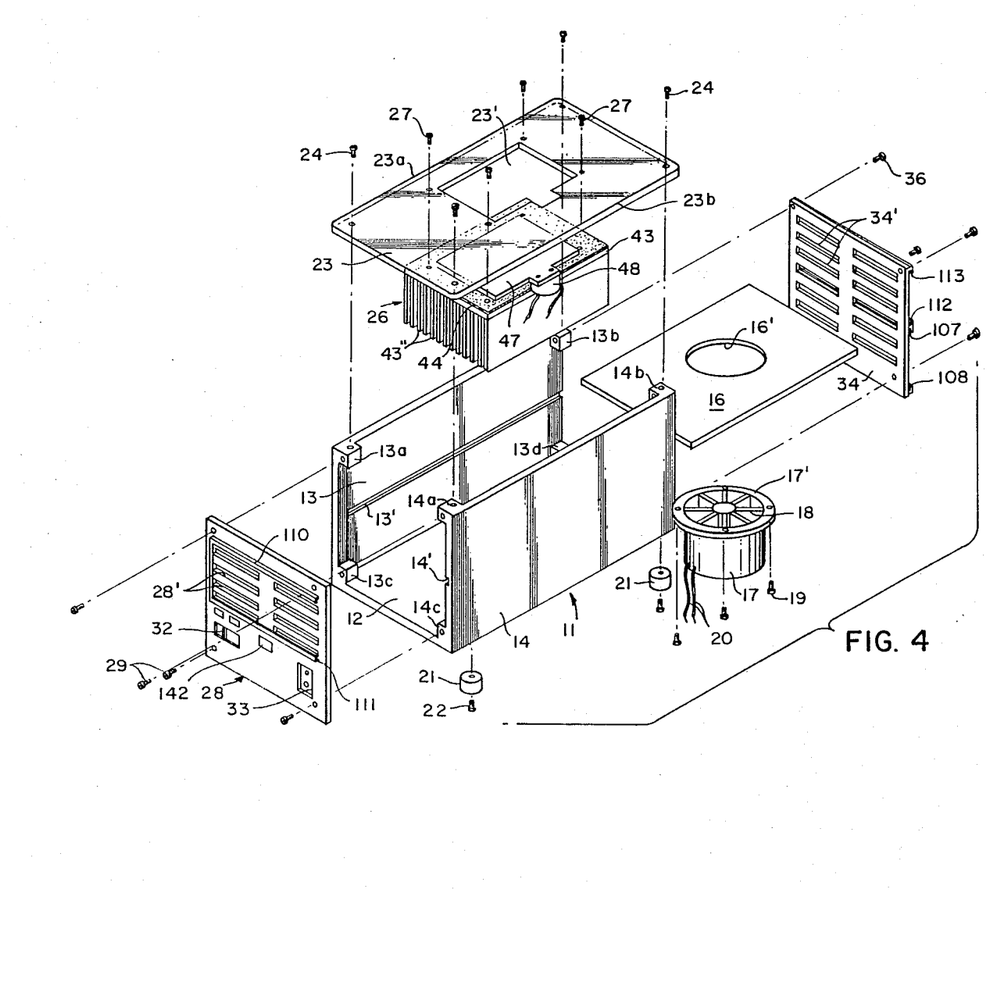
FIG. 4 is an exploded view of the thermoelectric base unit showing its separable parts in perspective, and the order in which parts are assemble to make up the unit.

A central pocket 23' within the top plate 23 of the base unit 10 FIGS. 3 and 4, is cut away to expose the cold and heat transfer plate 47 for flush engagement with a corresponding cold or heat transfer late of each of the appliances. In FIG. 3, it should be noted hat the top surface of the base top of the plate 23 is elevated above plate 47 to provide but a shallow pocket area 23' into which the exact sized corresponding heat transfer plate of the appliance will be dropped for flush engagement with the transfer plate 47 and the appliance transfer plate to be specifically mentioned in connection with each of the appliances as they will be described. As viewed in FIG. 3, it will be noted that a shoulder stop edge 23" will have been provided against which leading edge of a depending corresponding cold or heat transfer plate of an appliance will be engaged to arrest the sliding movement of the appliance upon the base unit on the appliance being assembled thereto so that the appliance plate will fully settle down in the shallow pocket 23' for full flush engagement with cold or heat transfer plate 47 of the base unit 10. Otherwise there would be difficulty in centering the appliance upon the base unit 10. It is critical to have cold and heat transfer surfaces to have flush engagement with on another. The stop edge 23" will position the appliance properly upon the base unit 10 so that a plate of the appliance drops automatically and properly into the base in the shallow pocket 23' upon the appliance being placed upon the base unit 10.

Figures 1, 2:
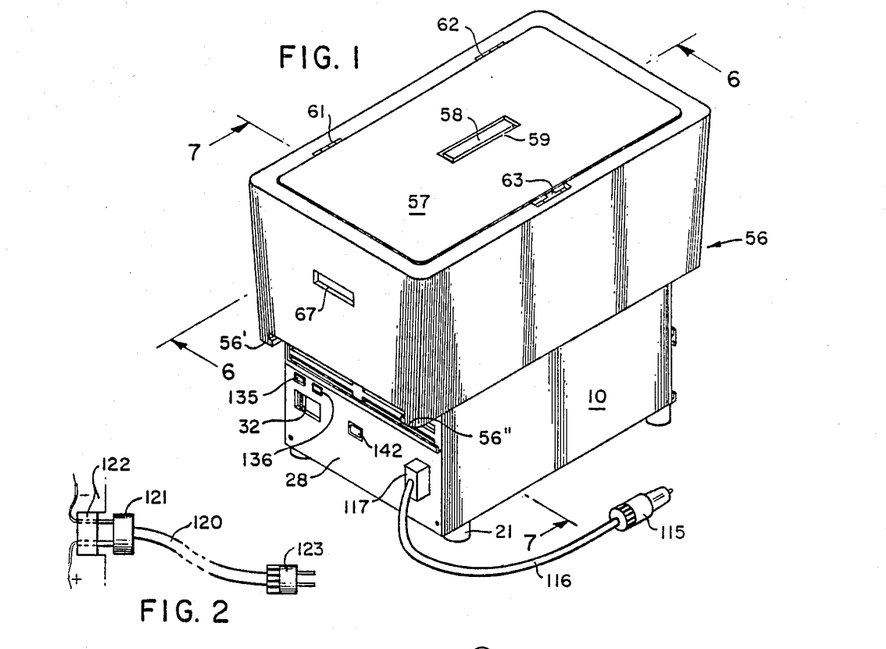
FIG. 1 is a perspective view of the thermoelectric base unit and a detachable storage appliance assembled in tight fitting surface to surface cold and heat transfer engagement with one another adapted to be plugged with the dashboard lighter receptacle.
FIG. 2 is a recycle convertor and cable conversion connection for use with an alternating current household receptacle.
Figure 6:
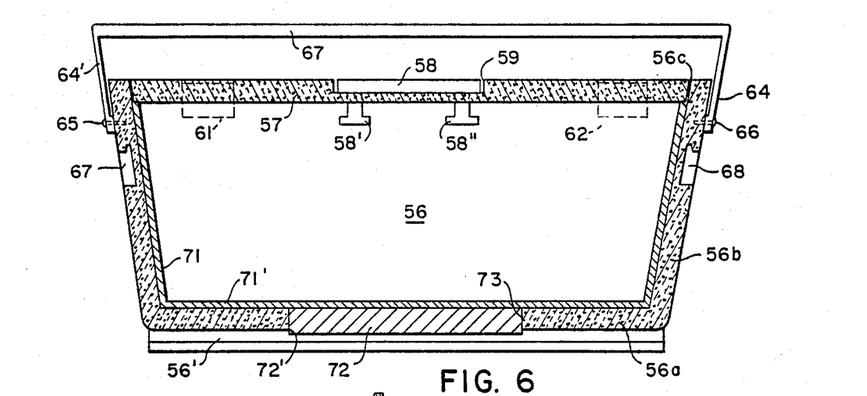
FIG. 6 is an enlarged longitudinally-extending sectional view of the storage appliance of FIG. 1 as viewed along line 6—6 and looking in the direction of the arrows.
Figure 7:
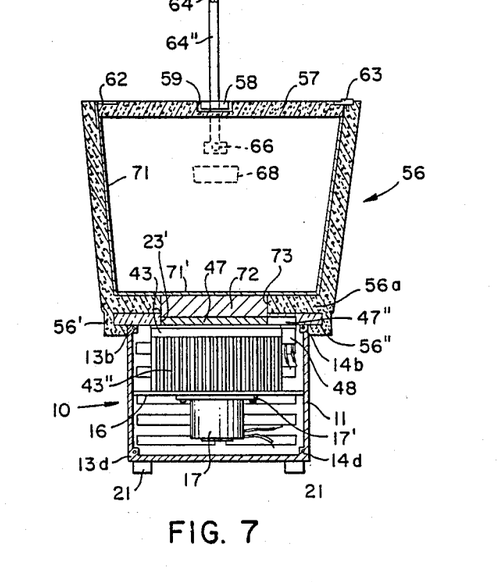
FIG. 7 is a vertical transverse sectional view of both the storage appliance and base unit of FIG. 1 as viewed on Line 7—7 thereof.
Figure 8:
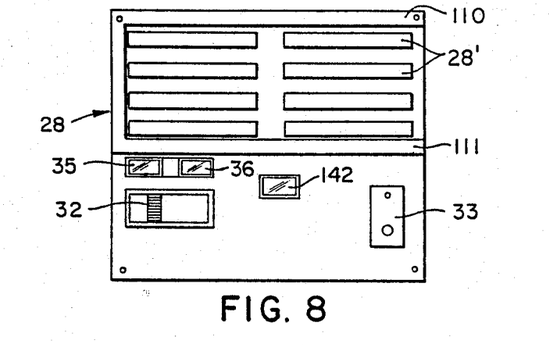
FIGS. 8 and 9 are respectively front and side end, elevational views of the front end plate of the base unit.
Figure 9:
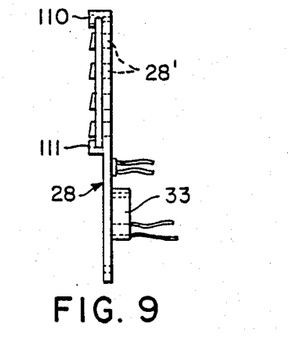
Figures 10, 11:
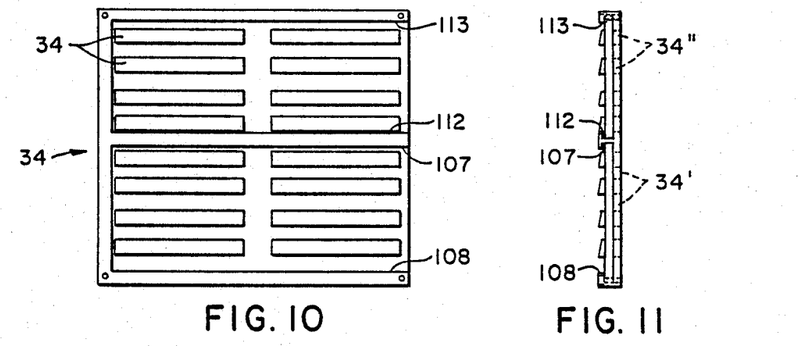
FIGS. 10 and 11 are respectively rear and side end elevational views of the rear end plate of the base unit.

The insulating top plate 23 has side edges 23a and 23b, that extend outwardly of the respective walls 13 and 14 of the channel-shaped housing part 11 to accommodate opposing grooved portions 56' and 56" depending from the bottom of a storage or ice chest appliance 56, FIGS. 1, 6 and 7. This storage appliance 56 is slid into place upon the base unit 10 from the front or rear of the base unit 10 by matching the grooves 56' and 56" with the respective side edges 23a and 23b of the top plate 23 of the base unit 10. The other appliances are to be similarly assembled upon the base unit by the use of side edges of the top plate 23 for flush engagement of their heat conducting plate with the temperature conducting plate 47 of the base unit 10 in the shallow pocket 23' The sliding movement of the appliance continues until interrupted by the engagement of the leading edge of the appliance conductor plate with the transverse stop edge 23" of the shallow pocket 23' of the insulating top plate 23 when the appliance automatically drops for full flush engagement of its depending conducting plate with the base unit conducting (plate 4). The tolerances of the groove projections 56' and 56" with side edges 56' and 56" of the insulating top plate 23 of base unit 10 being such as to permit the full flush engagement of the cold and heat conducting plates of appliance and base unit with one another and the assembly held tightly against separation due to vibration of the vehicle and during transport.

The ice chest or heat storage appliance 56 is generally of the size of the standard portable ice packed chests used for picnics and by campers. With the present storage appliance cold or heat will be supplied from the base unit 10 instead of consuming much of the internal space for ice cubes for effecting the same purpose. Ice cubes will not be needed to cool the chest but can be included to further sustain the cool temperature. So long as the chest 56 is on the base unit its internal temperature will be maintained.

The storage appliance 56 is molded out of heat insulating plastic material and is generally slightly tapered in contour with a bottom 56a, FIGS. 6 and 7 from which the opposing grooved portions 56' and 56" depend, and an upwardly and outwardly flared surrounding sidewall 56b with an enlarged top opening 56c into which a flat top detachable cover 57 also made of heat insulating plastic material is tightly taper fitted. To lift the cover for access to the appliance 56, a pull carry handle 58 normally lowered into a top slot 59 is pulled out of the slot to the extent of its depending stop legs 58' and 58". This cover 57 is connected at one side of sidewall 56b by spaced hinges 61 and 62 and held closed by a latch keeper 63 on the opposite sidewall and cover. The appliance when free of the basic unit 10 can be also carried by a long handle 64 extended over the cover and having depending legs 64' and 64" respectively pivotally connected to the respective opposite ends of the chest appliance 56 by respective pivot pins 65 and 66. Also, hand grip cut outs 67 and 68 are provided in the respective opposite end wall portions of the appliance 56 by which the chest appliance can be carried with both arms when heavily laden.

Figures 12, 13:
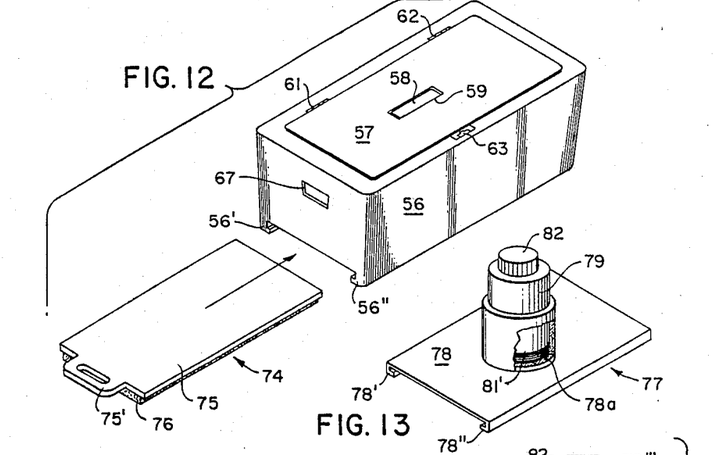
FIG. 12 is a collective perspective view of the storage appliance removed from the base unit and of a bottom insulating cover adapted for use with the storage appliance to cover it's cold and heat transfer plate in its bottom.
FIG. 13 is a top perspective view of a bottle warming or cooling appliance adapted to be assembled to the base unit.

For best transfer of cold and heat the interior of chest appliance 56 is lined with a sheet 71 of good cold and heat conducting metal of thin gauge aluminum having a bottom 71' to which is conductively fixed a thick metal aluminum block 72 that depends through a central opening in the bottom insulation 56a to a point below the bottom face thereof and that will depend, when the chest appliance has been slid in place upon base unit 10, into shallow pocket 23' for flush engagement of the block 72 with the cold or hot metal plate 47 of the base unit 10. There will be some tolerance provided in the grooved projections 56' and 56" to allow sliding movement, of the forward edge 72' of the depending block 72 to be lifted over the starting rear edge of the hot plate 23 of the base unit 10. The depending block 72 of the appliance 56 is the exact size area of the shallow pocket 23' of the base unit 10 so that once the block edge 72' engages stop edge 23" of shallow pocket 23' the block 72 will drop into the shallow pocket 23' for flush engagement with metal plate 47 of the base unit whereby the assembly will be made ready for use and efficient transfer of the cold or heat is ensured. Since the shallow pocket 23' is so shallow that the chest appliance 56 would not be restrained for detachment from the base unit but for the depending slide groove projection 56' and 56" overlying the side edges of the top plate 23 of the base unit. The grooves of the depending projections may not be essential to the mounting of the appliance of the base unit. The projections may be omitted from the appliance and the appliance merely lowered into place upon the base unit. Upon thickening the block 72 of the chest appliance and deepening of the shallow pocket 23 to a greater extent, the retention of the appliance so mounted upon the base unit would be greatly enhanced. The appliance 56 is rested upon the depending projections when freed of the base unit with the depending metal block 72 being protected and raised from chest bottom face. With the grooves properly fashioned, the conducting plates of the appliance and the base will be effectively wedged down upon the base unit to further enhance their best flush engagement for conduction of cold and heat and prevent release of the appliance from the base unit due to vibrations of the vehicle. In FIG. 12, there is shown the chest appliance 56 removed from the base unit 10 after it has been treated with cold or heat. Upon the removal of the chest from the base unit, the metal block 72 in the bottom 56a of this chest appliance 56 will have become exposed to external temperatures and in order to maintain this temperature attained within the appliance, an insulating bottom cover 74 is slid between the grooved projections 56' and 56" to provide extra insulation thereunder. This bottom cover 74 has a top portion 75 of hard insulation material and a bottom portion 76 of soft insulation material adhered to the hard top portion 75.

Figures 14, 15:
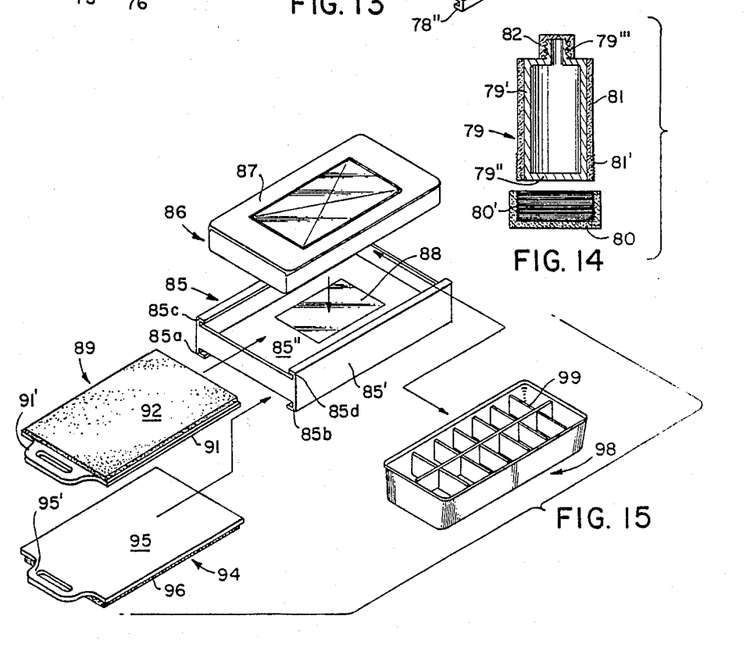
FIG. 14 is a collective vertical sectional view of the special bottle appliance being used in FIG. 13 with an insulating bottom cover to close over the metal bottom of the bottle.
FIG. 15 is a collective perspective view of an insulated hostess tray appliance for receiving a metal covered cake tray or an open ice cube tray with partitions and a top insulating cover for closing tray appliance and along with a similar insulated plate for covering the cold and heat transfer plate in the bottom of the tray appliance.

The assembly of the two portions constitutes the bottom slide cover 74. The hard top portion 75 has a hand grip extension 75' to facilitate the insertion and removal of the bottom cover 74 within the depending grooved projections 56' and 56". This same bottom cover 74 will be usable with the other appliances to be presently described for the same purpose of covering the bottom conducting plate of each appliance when they are removed from the base unit 10. Other appliances equally usable in a like manner with the base unit 10 will now be described. In FIGS. 13 and 14, there is shown a bottle cooling or heating appliance indicated generally at 77 adapted to be slid onto the base unit 10. This appliance 77 includes a slide plate 78 of hard insulating material having depending opposing grooved projections 78' and 78" that respectively receive opposite side edges 23a and 23b of the top plate 23 of the base unit 10. The plate 78 has a hole 78a through which a special bottle assembly 79 can be dropped onto the cool or hot plate 47 of the base unit 10 and to better confine the bottle 79 which being cooled or heated. A cylindrical transparent sleeve extends upwardly from slide plate 78 from about the opening 78a and having an internal diameter to snugly accommodate the bottle 79 free of its bottom insulating cover 80 that is threaded upon the bottom of the bottle 79 after the contents have been cooled or heated to maintain the temperature of the contents within the bottle. The metal bottle 79' is coated about its side with thick insulation 81 that is threaded at its lower end 81 to receive internal threads 80' of bottom cap 80. The metal bottle 79' has a flat exposed bottom 79" when the insulating cap 80 is removed and that rests in flush cold or heat conducting engagement with the metal conducting plate 47 of the base unit 10. The bottom cap 80 when connected will thread flush against the flat metal bottom portion 79". The top of the internal metal bottle 79' has a threaded top neck portion 79 to which an insulating cap 82 is threaded to close the bottle.

In FIG. 15, there is shown a hostess metal tray receiving appliance 85 having a semblance of the chest appliance but of less depth and adapted to accommodate either a metal cake pan 86 with its windowed cover 87 or an ice cube tray 98. This cake pan receiving appliance 85 formed of plastic insulation material with a continuous side wall 85' and a bottom 85" with a centrally-disposed cold and heat conducting slab or plate 88 that in turn depends from the bottom face to enter the shallow pocket 23' of the base unit 10 in the manner already set forth in connection with description of the chest appliance 56. The metal cake pan and ice cube tray receiving appliance 85 will rest by its bottom upon cold and heat conducting plate 88. This hostess appliance 85 has depending opposing side grooved projections 85a and 85b adapted to receive respective side edges 23a and 23b of the base unit 10. With the hostess tray appliance 85 slid over the top plate 23 of the base unit 10 from the rear thereof, the leading edge of the appliance plate 88 is arrested on engagement with the drop edge 23" of the shallow pocket 23' of the base unit 10. Both appliances 56 and 85 are accordingly easily assembled upon the base unit 10 to ensure flush engagement of their cool and heat conducting plates 72 and 88 with the cool and heat conducting plate 47 of the base unit. Over the base unit plate 47 a lining similar to lining 71 of the chest appliance 56 may be used with this tray appliance 85 and attached to its bottom slab 88 to distribute the cold or heat taken therefrom within the appliance.

The bottom of the appliance 85 is accordingly provided with depending opposing groove projections 85a and 85b to accommodate the respective side edges 23a and 23b of the top plate 23 of the base unit 10 for the assembly of the appliance 85 thereto corresponding to the way the other appliances have been assembled thereto. The grooves of the depending projections 85a and 85b will have some tolerance to permit the lifting of the lowered portion of the appliance slab 88 to be passed over the base unit plate 23 into the shallow pocket 23' for flush engagement with the conducting plate 47 of the base unit 10. The tolerance of the appliance grooves should only be slight if at all, for the purpose of getting the leading edge of the depending appliance plate 88 over the end edge of the top plate 23 of the base unit 10.

With the cake pan 86 and it cover 87 within the appliance 85 it will be covered b a slide cover 89 made of a hard sheet of insulating material 91 and a layer 92 of soft insulation material adhered thereto. The hard sheet 91 has a rearwardly-extended handle portion 91' by which the cover is manipulated into opposing top groove portions 85c and 85d to enclose the appliance 85 while being cold or heat treated upon the base unit 10 and thereafter upon being removed therefrom. This cover 89 can also be used as a bottom cover adapted to slide similar to the bottom cover 74 of the chest appliance 56, see FIG. 12. Better yet it is to have another cover 94 to be placed in the bottom of the tray appliance 85 between the grooved depending projections 85a and 85b thereof so as to cover the appliance bottom conducting plate 88 upon the appliance being removed from base unit 10. This bottom cover comprises a hard top sheet 95 with a handle portion 95 and a soft insulating layer 96 adhered thereto. With both covers 92 and 95 in place, the temperature cool or warm will be maintained for a long time in the hostess tray appliance 85.

The present basic unit 10 is intended to operate on 12-volt vehicle storage battery and with the specific Peltier elements 41 and 42 being used in the base unit 10, a temperature of up to 180 degrees F. can be obtained within the appliances and the food held at a temperature suitable for serving. Cooking temperatures are not intended with the present assembly thus if the temperature of the base unit is maintained at substantially 180 degrees F. by the bimetallic thermostat 48 carried by the base unit cold and heat conducting plate 47 there is little likelihood of the Peltier elements being disintegrated and burned out. While the elements could have a temperature of 220 degrees F. to boil water, there is no necessity to risk the loss of the elements for more than to maintain a warming temperature. Accordingly, a thermostat heat control for the base unit has been provided. Should it be desired to have a thermostat to operate the cool temperature it can be included in the circuitry. When the unit 10 is used for cooling, there will be no concern for disintegrated and burned out. While the elements could have a temperature of 220 degrees F. to boil water, there is no necessity to risk the loss of the elements for more then to maintain a warming temperature. Accordingly, a thermostat heat control for the base unit has been provided. Should it be desired to have a thermostat to operate the cool temperature it can be included in the circuitry. When the unit 10 is used for cooling, there will be no concern for the disintegration of the elements. However, if the voltage were increased for the operation of the unit a cool control thermostat would be incorporated. Another thermostat would be applied to the conduction plate 47 of the base unit 10 with enlargement similar to 47" that supports the present heat control thermostat 48, as say at the opposite side of the plate 47, but free of the shallow pocket 23'. The several cold and heat conducting plates for the base unit and the appliances are made of aluminum and conduction of cold and heat is effected through joined plates in flush engagement with one another within the base unit and between the base unit 10 and the appliances. The top faces of the elements are cold while their bottom plates run hot with heat spread over the top faces of the elements 41 and 42 and transferred to plate 47, the thermostat 48 registering the temperature of the top plate and the elements.

Should the temperature run higher than around 180 degrees F. the supply circuit will be temporarily shut off by the thermostat 48. When the underfaces of the Peltier elements 41 and 42 normally run hot at times of effecting a cooling condition, the fan 18 must be operated to take off the heat from the block 43 on which the bottom faces of the elements rest. The cooling fan 18 by blowing cooking air over block fins 43' reduces the temperature of the sink block 43 and the elements to within 15 to 20 degrees F. of the ambient room temperature, the top cooling faces of the elements and the conducting plate 47 imparting the necessary low cooling temperatures to the appliances. By reversal of direct current through the elements and omitting the operation of the fan 28 the elements will become sufficiently hot to impart warming temperatures to the appliances and maintain some 180 degrees within them. The elements are well embedded in insulation within the base unit 10 to prevent indirect cool or heat losses, and cool or heat escapes only through conductor plate 47 to operate the appliance. It should be now apparent that the several appliances can be rapidly assembled upon this thermoelectrically-operated heart and cool generation base unit 10, and that any number of different designed appliances can be put to use with this base unit. With the insulating top and bottom covers of the appliance in place, the gathered temperatures in the appliance can be maintained for a considerable period of time.

When it is desired to make ice cubes to be used for cooling food and liquids this can be easily effected with the use of a cube tray 98 having the usual ice cube size partitions 99 and placed in the hostess tray 85. This tray is made of cool conducting material which will be set flat upon the metal conducting slab 88 within the hostess tray 85, the metal cake pan 86 having been removed, and the tray 85 with the ice cube tray slide assembled upon the base unit 10 with its slab 88 in flush engagement with conducting plate 47 thereof in the manner above described. The base unit 10 will be switched to cold operation with its fan 18 directing cooling air through the block fins 43' with air suitable for freezing ice.

Since this assembly likely could not normally be used in summer atmosphere to produce a freezing temperature, it has been found that with the assembly placed in a vehicle which is air conditioned and directly using the air from one of the air conditioner outlets for cooling the block fins 43', the tray temperature with the appliance 85 and about the ice tray 98 therein can be brought sufficiently low to effect the freezing of the water within the ice tray and the formation of the ice cubes within the divider partitions 99.

Figures 16, 19:
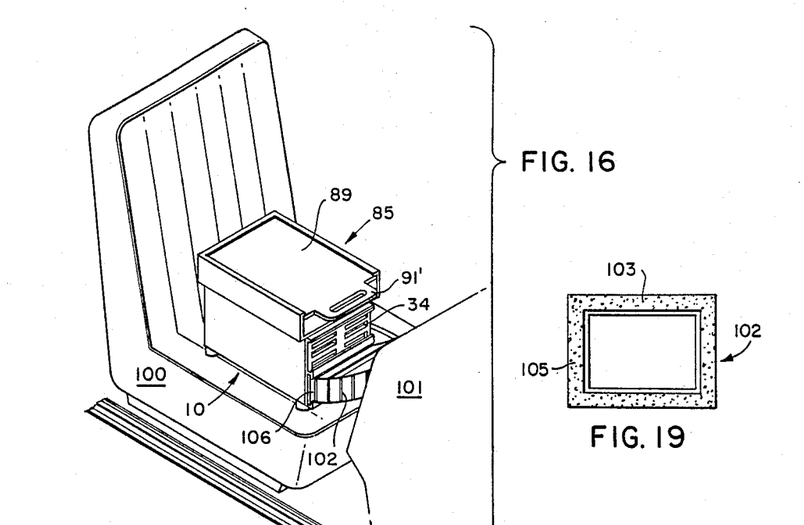
FIG. 16 is a perspective view of a base unit resting on the front seat of the vehicle and connected to its dashboard to receive controlled hot or cold air from the vehicle air conditioner.
FIG. 19 is an end view of the end of the flexible air conduit looking upon the attaching surface for affixing the conduit to the dashboard surface bout the vent opening therein.
Figure 17:
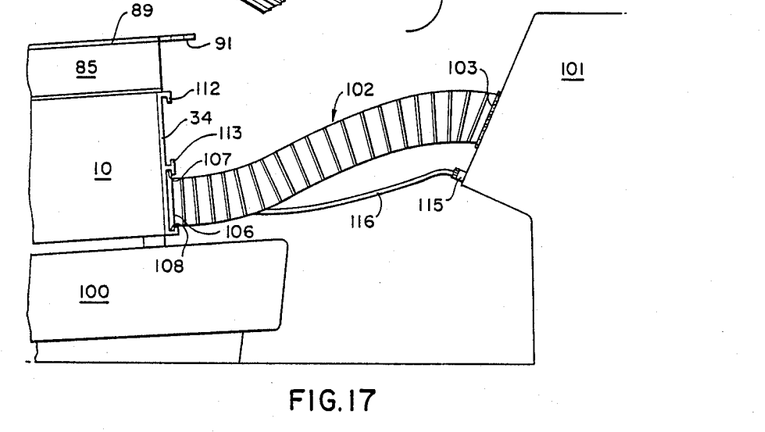
FIG. 17 is a side elevation view of the arrangement shown in FIG. 16 but showing the connection of the air conduit with the dashboard and the cable with its direct current supply plug inserted in the cigarette lighter receptacle.

To carry out this ice freezing operation, the ice cube tray 98 is placed in appliance 85 covered by the cover 89 and slide the assembly fitted upon the base unit 10 located upon a front seat 100 within a vehicle, FIGS. 16 and 17, where there is easy access to a cooling air outlet in a dashboard 101 of a vehicle to which the base unit is connected by a collapsible tube 102 of rectangular or round cross-sectioned shape that can be collapsed for the purpose of storing under a car seat or elsewhere and made preferably of suitable flexible plastic material. At the end of the tube 102 that connects with the dashboard 101, there is a rectangular-shaped flange 103 that is coated with a material 105 for adhering the flange and the tube 102 over the ventilation outlet in the dashboard 101 so that cold air will be delivered into the tube 102 from the vehicle air conditioning system at temperatures of some 40 degrees Fahrenheit.

Figure 18:
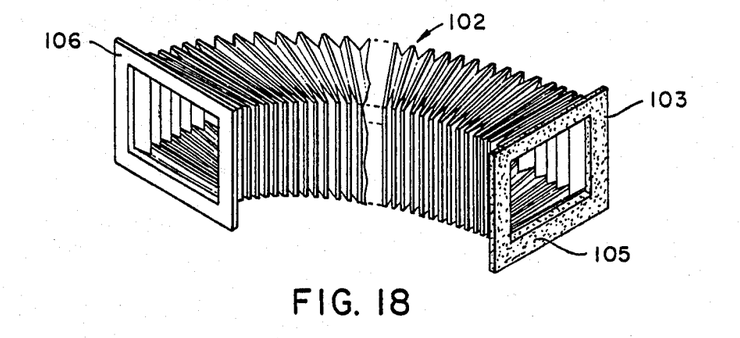
FIG. 18 is a fragmentary perspective view of the flexible air conduit that can be slide fitted onto the base unit and connected.

The other end of the tube 102 that connects with the base unit 10 also has a flange 106 that can be slide fitted laterally into sets of opposing upper and lower grooves 107 and 108 on the rear end plate 34 of the base unit 10. This cold air is delivered by muffin-type fan 17 which in turn delivers outlet air upwardly from the bottom compartment of the unit through plate opening 16' of slide plate 16 from which the fan 17 is supported and over the block fins 43", the cooling air divides in the upper compartment of the unit, passes outwardly through the upper louvers of both end plates 28 and 34 into the ambient surroundings of the vehicle. Such air will be warmed on passing through the fins 43" and will be brought to as close as possible to the ambient temperature of the vehicle. The temperature within the appliance 85 by the use of this cold air conditioner air will be lowered more effectively in the appliance by some 40 degrees F. or more to permit and effect the freezing of the water so as to provide the ice cubes. With the cold air from the air conditioner, frigid temperatures are possible so that when exhausted air into the cold ambient air of the vehicle from the base unit 10 it incidentally lowers the ambient temperatures of the vehicle to some extent. Only when ice is to be made is the air conditioning air used. The assembly can be located on the floor in back of the front seat by passing the flexible tube 102 flatwise under the front seat instead of on the front seat of the vehicle.

For example, with a forced cold air flow from the air conditioning system of the vehicle at a temperature of some 40 degrees F. feeding into the base unit 10 thru the heat sink fins 43' is exhausted from the base unit at approximately 60 degrees F. The normal ambient temperature of a vehicle by the base unit thus reduces the vehicular ambient temperature by some extent.

The flange end 106 of the tube 102 can be laterally slid into in opposed grooves 110 and 111 to supply the air through louvered openings 28' of the front end plate 28 that carries the electric controls also, the flange 106 can be attached over the upper louvered openings 34' in the rear end plate 34 by sliding the flange end 106 between opposing upper and lower grooves 112 and 113 thereof. Louvre openings can be closed by sliding closure plates, not shown, between the corresponding sets of grooves for them. The warm air from the vehicle heat ventilating system rather than from ambient air would assist in the raising the temperature of the transfer for heat and accelerate the heating of top plate 47.

As seen in FIGS. 1, 16, and 17, the base unit 10 is supplied with direct current from a vehicle battery by round plug 115 adapted to be inserted in a cigarette lighter receptacle normally found on the vehicle dashboard 101 and a cable 116 that is connected by a block plug 117 inserted in input receptacle 33 carried on the front plate 28.

For home use a cable 120 as seen in FIG. 2, having a converter plug 121 is inserted into an alternating current household receptacle 122 and a cable plug 123 is inserted in the base unit receptacle 33 on front plate 28 and in lieu of the plug 115 of the cable 116 for the cigarette lighter. Thus, the appliances can be used with an alternating currents source free of the need for a direct current battery as in a motel, or household.

Figure 20:
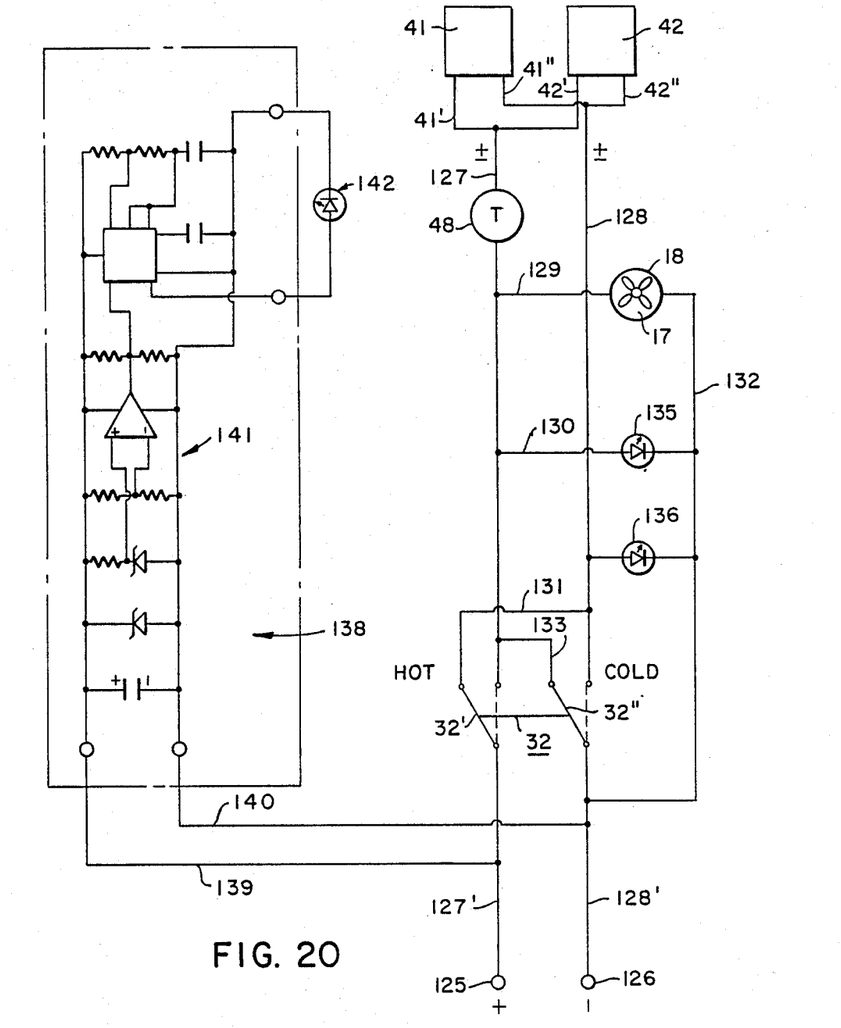
FIG. 20 is wiring diagram for the electric control circuit of the thermoelectric base unit.

In FIG. 20, there is shown the wiring of the control circuit for the base unit 10 and the operation of the thermoelectric elements 41 and 42 from a direct current 12-volt vehicle battery, the positive and negative terminals being respectively indicated at 125 and 126. The thermoelectric elements 41 and 42 are connected together in parallel relationship with positive leads 41' and 42' joined and negative leads 41" and 42" similarly joined and by positive and negative lines 127 and 128 respectively running toward the respective positive and negative battery terminals 125 and 126 by way of the switch 32 on the front end plate 28 of the base unit 10, such switch being a double pole and throw switch a diagrammatically illustrated.

The thermostat 48 is contained in the line 127 and will on being overheated open the current supply from the battery to save the thermoelectric elements 41 and 42 from disintegration and damage. The circuitry will be opened up until the elements are cooled. This interruption occurs only when the unit is conditioned for heating and when fan 17 is not being used.

The fan 17 is connected by line 129 from line 127 outside of switch 32 and line 132, line 128' and to negative terminal 126. Positive and negative terminals 125 and 126 by wires 127' and 128' are respectively connected to respective pole arms 32' and 32'', the positive terminal 125 by a wire 127' to pole arm 32' and the negative terminal 126 by a wire 128' to pole arm 32''.

With the pole arms 32' and 32'' in full line positions as shown, the electric fan 17 is shunted from wire 128 and by passing of current from positive terminal 125 will cross by switch wire 131 become a positive wire and wire 127 becomes the negative wire through switch wire 133 to negative terminal 126. Fan light 135 will be across positive and negative wires to indicate heating. Current then passes through the elements so that their top faces become hot and heat is delivered to the appliances. The overheated thermostat will turn off the heating.

When cold is to be delivered by the top faces of the elements 41 and 42 the switch pole arms are turned to the dotted line positions and terminal 125 and 126 are put through 127' and 128' directly to the wire 127 and 128. Positive current flows up wire 127 to elements 41 and 42 and then down wires 128 to negative terminal 126. Fan 17 and signal light 136 are put across the wires 127 and 128 by wires 129 and 130 and wire 132 to wire 128' and terminal 126. Signal light 135 will have been extinguished. Since the fan 17 is operating to pass air over block fins 43' heat is drawn over the bottom face of the elements 41 and 42 so as to allow the top face to be cold without interference from heat.

In order to give indication of the voltage of the direct current being supplied at the terminals 127' and 128', a printed circuit board 138 has been provided and on the front end plate that will take current by use of wires 139 and 140 from respective battery wires 127' and 128' and terminals 125 and 126 and deliver it through the various electronic circuitry indicated generally at 141 that will turn on signal light 142 if the battery should need charging. This signal 142 appears on the front panel of the base unit, see FIGS. 1 and 3.

This low voltage battery trouble light remains off during normal operating times and will blink only when the battery voltage drops below its normal output voltage needed for efficient operation of the base unit 10. When the cold mode is being effected, the light 136 which is green will be activated and the fan 17 under the sink block 43 will be operated to cool the fins 43' to reduce this temperature and accelerate the cooling process in the cold plate area.

When the warm mode is in effect, the light 135 which is red will be activated, but the fan 17 will not be activated. The heat sink block 43 and its fins 43' will become warm and will accordingly accelerate the heating of the top conductive plate 47 and the thermostat 48 operable to prevent overheating and injury to the elements. The temperature of the elements and the plates are kept at some 180 degrees F. that is the average temperature at which food is eaten.

It should now be apparent that there has been provided an arrangement of a cold or heat base unit to which many different appliances can be quickly detachably attached to be either cooled or heated by the base unit 10 and by which with utilization of cold air from the vehicle air vent, ice cubes may be obtained. The base unit 10 in operation of itself, will still give off air of less temperature than the ambient air temperature within the vehicle, thereby to assist in the cooling of the passenger space.

While various changes may be made in the detail construction, it shall be understood that such changes shall be made within the spirit and scope of the present invention as defined by the appended claims.

What is claimed is:

1. In combination, a thermoelectric heating and cooling unit for use in a vehicle comprising one or more thermoelectric elements having top and bottom faces, a top conducting plate in thermal contact with the top faces of the said thermoelectric elements, said top and bottom faces being cold or hot when said current is applied depending on the direction of said current, and an insulating plate surrounding said top conducting plate to permit its flush exposure, an appliance having heat or cold transfer bottom, means for detachably mating said appliance so as to be rigidly positioned upon the insulating plate with its heat or cold transfer bottom held in flush thermal contact with said conductive plate of the unit and so that said appliance does not become disconnected due to vibration of said vehicle, whereby the continued supply of heat or cold to said appliance will be insured to heat or cool any substance contained therein, said mating means of said unit similarly enabling said unit to interchangeably mate with corresponding means of a plurality of different appliances so that said unit can be used interchangeably to supply heat or cold to a plurality of different appliances.

2. In combination an appliance for use in a vehicle, a thermoelectric heat or cold unit having a first mating means for receiving said appliance and including a thermally insulated upper body portion with a heat or cold conductive plate therein, said appliance having a bottom thermally conductive portion, means for detachably mating the appliance with the heat or cold unit in a rigid position so that the bottom surface of the appliance lies in thermal contact with the conductive plate of said unit despite vibration of said vehicle and to ensure the supply of heat or cold to said appliance, said appliance including a second mating means and a bottom cover attachable to the second mating means of the appliance to enclose the bottom conductive plate of the appliance.

3. In combination, a thermoelectric cool and heat base unit utilizing Peltier-type elements having cold and hot faces when supplied with direct current, and respective top and bottom faces of the elements being cold or hot depending upon the direction of flow of the direct current through the elements, a metal heat sink block in flush engagement with the bottom faces of the element and a top cold and heat conductive plate secured in flush engagement with the top faces of the elements, and a separable appliance having a bottom cold and heat conductive slab depending from the bottom of the appliance and adapted to be disposed in full flush engagement with the top conductive plate of the base unit upon the appliance being assembled upon the cool and heat base unit, said base unit having a top insulating plate overlying the cold and heat conductive plate with a central opening therein to provide a shallow pocket adapted to receive the depending cold and heat conductive slab of the appliance for a full flush engagement with the conductive plate of the base unit and means for detachably mating the separable appliance with the base unit and the retention of the conductive slab of the appliance with the conductive top plate within the shallow pocket of the base unit against lateral and upward displacement from the base unit whereby heat or cool transfer of the base unit will be maintained throughout the transport of the assembly and will be held against separating thereof due to vibration of the transport vehicle.

4. The combination as defined in claim 1 and a selective switch control means for either causing the operation of the fan when direct electrical current is being directed to cause cold air to be delivered from the top plate of the base unit to the bottom metal plate of the appliance or when direct current is directed to the elements in the opposite direction without the operation of the fan.

5. The combination as defined in claim 2 and said appliance being an insulated metal lined body enclosure with detachable top and bottom insulated cover parts and the said internal metal lining in conductive relationship from the bottom cold and heat conductive plate thereof.

6. The combination as defined in claim 3 and said enclosure being a slidable insulating assembly having a central opening therein to house an insulated bottle having an exposed metal bottom serving as the appliance cool or hot plate to cool or heat any contents of the bottle upon mating with the cold and hot plate of the base unit, said bottle being removable from the slidable assembly and with an attachable insulating bottom cover cap for the bottle to ensure internal liquid temperature maintenance when removed from the base unit.

7. The combination as defined in claim 2 and said insulated appliance including a top cover, an ice cube tray disposed in said appliance with water to be frozen and oblong shaped flexible air delivery tubing connected to the base unit to supply ventilating air from a vehicle air conditioner at temperatures lower than the ambient air about the assembly, whereby the temperature within the appliance will be sufficiently reduced to provide ice cubes from the water.

8. The combination as defined in claim 2 add said air delivery tube system from the base unit to vehicle ventilating vents and comprising any combination of adapters to said vents in connection with aforementioned flexible tube or any required combination of a non-flexible and flexible assembly to provide rear of vehicle or other location usage of the base unit with appliances.

* * * * *